United States Patent [19]

Stetter et al.

[11] Patent Number: 4,745,078
[45] Date of Patent: May 17, 1988

[54] METHOD FOR INTEGRATED SERIES CONNECTION OF THIN FILM SOLAR CELLS

[75] Inventors: Walter Stetter, Tiefenbach; Winfried Peters, Neubiberg, both of Fed. Rep. of Germany

[73] Assignee: Siemens Aktiengesellschaft, Berlin and Munich, Fed. Rep. of Germany

[21] Appl. No.: 946,919

[22] Filed: Dec. 29, 1986

[30] Foreign Application Priority Data

Jan. 30, 1986 [DE] Fed. Rep. of Germany ....... 3602798

[51] Int. Cl.$^4$ ............................................. H01L 31/18
[52] U.S. Cl. ......................................... 437/4; 437/2; 437/51; 437/205; 437/228; 136/244; 136/258
[58] Field of Search .......... 29/572; 136/244, 258 AM; 437/2, 4, 51, 205, 228, 233

[56] References Cited

U.S. PATENT DOCUMENTS 4,243,432 1/1981 Jordan et al. ..................... 136/244
4,517,403 5/1985 Morel et al. ..................... 136/249

OTHER PUBLICATIONS

Yamazaki et al., "Mask-Less Fabrication of A-Si Solar Cell Using Laser Scribe Process", IEEE Photovoltaic Conf., 1984, pp. 206 to 211.

Nakano et al., "New Manufacturing Processes for A-Si Solar Cell Modules", Fifth Photovoltaic Solar Energy Conf., 1983, pp. 712 to 716.

Primary Examiner—Aaron Weisstuch
Attorney, Agent, or Firm—Hill, Van Santen, Steadman & Simpson

[57] ABSTRACT

The present invention relates to a method for providing integrated series connections of a plurality of solar cells each of which includes a photovoltaic thin film on a common transparent substrate which involves depositing a strip pattern of a material which is readily removable from the photovoltaic thin film onto the film at intervals dependent on the size of the solar cells, the strips of the pattern being offset laterally relative to the front electrodes lying under the thin film and extending over the regions of the thin film which are not to be covered by the subsequently back electrodes. Separating grooves are then mechanically generated in the film adjacent the strips. An electrically conductive metal is deposited over the entire surface thus produced and finally the strip pattern is removed by lifting the pattern off the film, leaving gaps in the metallized layer forming the separated back electrodes of the solar cell.

14 Claims, 1 Drawing Sheet

METHOD FOR INTEGRATED SERIES CONNECTION OF THIN FILM SOLAR CELLS

BACKGROUND OF THE INVENTION

1. Field of the Invention

The present invention is in the field of providing integrated series connections of a plurality of photovoltaic thin film solar cells arranged on a common, isolating transparent substrate. Separating grooves are introduced into the thin film for the manufacture of electrically conductive connections between the individual solar cells and are filled with metal during manufacture of the back electrodes. The front electrode of one cell is thus connected to the back electrode of the neighboring cell.

2. Description of the Prior Art

A solar cell arrangement similar to that of the present invention is described, for example, in U.S. Pat. No. 4,517,403.

One of the principal problems, both in the manufacture of the solar cell, as well as in its later employment, is the contacting of the solar cells to each other. Usually, the n-conductive zone of one solar cell is connected in electrically conductive fashion to the p-conductive zone of an adjoining solar cell, the connection being by means of contact connectors of metal, such as silver. With solar cells of single crystal silicon, an external discrete wiring of the cells usually takes place, and this requires a considerable outlay of work.

Thin film solar cells of, for example, amorphous silicon (a-Si:H, amorphous silicon with bonded hydrogen atoms) can be generated on an insulating carrier. Due to the slight conductivity of the transparent front electrode, a plurality of small individual cells must be connected in series in the manufacture of large module surfaces in order to avoid losses of efficiency and in order to increase the module voltage. This is possible in the very simple way due to the basic common substrate. Strip shaped cells having operating voltage of, for example, about 0.7 volts can be formed. Cells having operating voltages of, for example, 12 to 24 volts, when series connected can thus be produced in the production sequence of cell manufacture.

The problem thus is to combine the series connection with the cell manufacture in a relatively simple way without deteriorating the efficiency of the solar cell.

The Fifth E.C. Photovoltaic Solar Energy Conference Proceedings, Kavouri, Greece, October 1983, pp. 712–716, as well as the Seventeenth IEEE Photovoltaic Conference, Orlando, Fla. 1984, pp. 206–211, disclose that a selective laser parting method can be employed for series connection of such thin film solar cells. In this method, known as laser scribing, the selective parting of the amorphous silicon layer and the subsequent selective parting of the metallized portions produces greater technical difficulty. In addition, methods involving laser systems are extremely costly.

SUMMARY OF THE INVENTION

The present invention provides an improved and less involved manner for resolving the above-mentioned problem and consists essentially of a method involving the following steps:

(a) A strip pattern of a material which is easily soluble in a solvent or is easily removable from the thin film surface is applied to the photovoltaic thin film at intervals defined in accordance with the size of the solar cells, the strip pattern being applied such that is laterally offset relative to the front electrodes lying under the thin film solar cell and covers the regions of the thin film that are not covered by the back electrodes which are later applied;

(b) The separating grooves are produced in the thin film solar cell in a mechanical way in accordance with the strip pattern and are laterally offset therefrom;

(c) A metallization across the entire surface is carried out; and (d) The strip pattern is removed by a lift-off technique, whereby the selective parting of the back electrodes results.

The preferred form of the present invention consists in applying the strip pattern such that it lies laterally offset relative to the front electrodes lying under the thin film solar cell and lying offset thereto by an amount which is the width of the parting trench.

BRIEF DESCRIPTION OF THE DRAWINGS

The method of the present invention will be set forth in greater detail with reference to an exemplary embodiment thereof, shown in FIGS. 1–7, which illustrate cross-sectional views of the various stages involved for the manufacture of a solar cell arrangement having integrated series interconnections.

DESCRIPTION OF THE PREFERRED EMBODIMENTS

Figure 1:
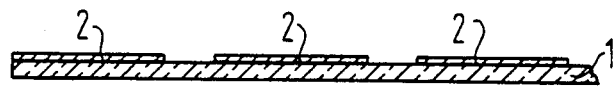

In FIG. 1, there is illustrated an illustrative transparent substrate 1 composed, for example, of glass or plastic which may take the form of a foil, together with a transparent conductive oxide consisting, for example, of doped stannic oxide which is applied and structured in a known way to provide front electrodes 2.

Figure 2:
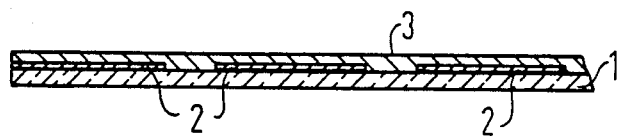

In FIG. 2, there is shown a thin film solar cell 3 which has been applied to the surface wide across the entire substrate and is composed of an amorphous silicon (a-Si:H) PIN structure which is produced by plasma deposition from hydrosilicon (silane) with the appropriate dopants.

Figure 3:
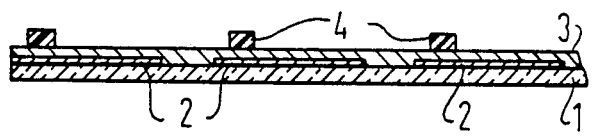

In FIG. 3, there is illustrated a strip pattern 4 composed, for example, of a self-adhesive plastic foil which is applied to the thin film surface 3 for later lift-off. The strip pattern 4 is applied such that it is laterally offset relative to the marginal edges of the front electrodes 2 which lie under the thin film solar cell 3. The amount of offset is equal to the width of the parting trenches which are to be produced. Instead of the plastic strip 4, a lacquer or a suitable foil pattern can also be applied mechanically. Alternatively, a silk screening method can be utilized to produce the strip pattern 4.

Figure 4:
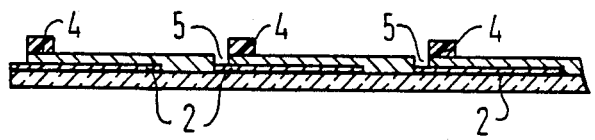

The selective mechanical separating of the thin film solar cells is illustrated in FIG. 4. This mechanical separating occurs without damage to the front electrodes 2, and is produced by milling grooves 5 into the thin film by means of super-fine millers, whereby the surface losses are kept within extremely low limits. As a result of the good adhesion and the hardness of the front electrode layer 2, the thin film 3 can very easily be selectively parted from the transparent conducting oxide layer 2 which lies therebelow. The surface removed lies on the order of magnitude of 5% (500 microns with a 10 mm cell width). Instead of milling, a grinding, sandblasting, sawing or planing process can also be employed to provide the grooves 5.

Figure 5:
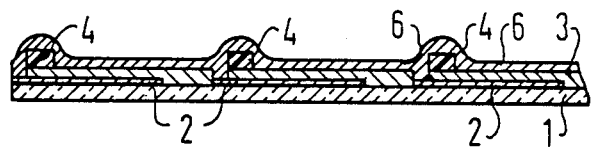
Figure 6:
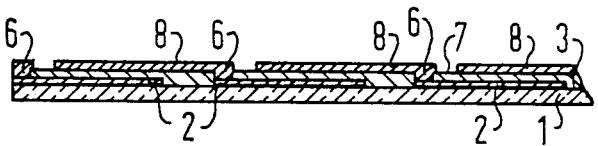

In FIG. 5 there is illustrated a metal layer 6, composed, for example, of aluminum or silver which has been applied to the entire surface of the underlying structure provided with the separating grooves 5. The metal layer is preferably applied by vapor deposition or by cathode sputtering and results in connecting the front electrode 2 of one cell to an adjoining back electrode 8 of an adjacent cell by filling the grooves 5 with the metal 6.

By pulling off or lifting off the strip pattern 4 such, for example, as by means of treatment in an inorganic solvent, preferably with the additional agitation of ultrasonic vibration, the metal layer 6 is then removed, i.e., lifted off at those locations at which the metal layer 6 was in contact with the strip pattern 4. Separating grooves 7 in the metallization layer are thus produced and the back electrodes 8 of the solar cell arrangement are formed from the metal layer. This produces a series connection between these two adjoining cells.

Figure 7:
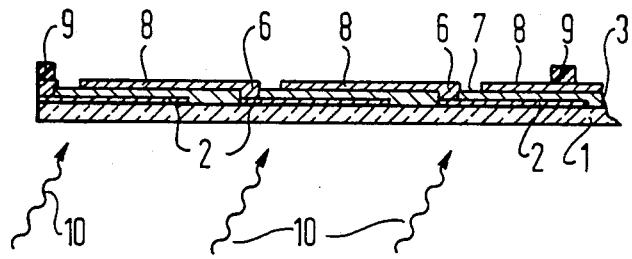

FIG. 7 shows the application of output contacts 9 to the entire assembly. The incident light entering the front electrode is illustrated with the arrows 10.

The method of the present invention is extremely well suited both for smooth surfaces as well as for rough surfaces and has no surface oriented limitation. The separating rate in mechanical parting of the thin film is on the order of 10 cm/sec.

The efficiency of thin film solar cells which currently is at about 8-10% is not deteriorated by the disclosed method of series connection.

The method of the present invention lends itself particularly to the manufacture of a superimposed series of multiple cells composed of individual solar cells produced as described.

It should be evident that various modifications can be made to the described embodiments without departing from the scope of the present invention.

We claim:

1. A method for providing integrated series connections of a plurality of thin film solar cells including thin photovoltaic films formed on a common insulative transparent substrate having spaced apart transparent front electrodes formed therealong with metal filled separating grooves being formed in said films as electrically conductive connectors between the individual solar cells, comprising:

depositing a strip pattern of a material which is readily removable from said thin photovoltaic film onto said photovoltaic film at intervals dependent on the size of said solar cells, the strips of said pattern being offset laterally relative to the front electrodes lying under said thin films and extending over the regions of said thin film which are not to be covered by subsequently applied back electrodes;

mechanically generating separating grooves in said films alongside said strips;

depositing an electrically conductive metal over the entire surface thus produced; and removing said strip pattern by lifting said pattern off said film, leaving gaps in the metallized layer forming the separated back electrodes of said solar cells.

2. A method according to claim 1 wherein the strips of said strip pattern are laterally offset from the marginal edges of the front electrode under said thin film by the width of the separating grooves.

3. A method according to claim 1 wherein said thin photovoltaic films are composed of deposited amorphous silicon.

4. A method according to claim 1 wherein said separating grooves are generated in said thin film by milling.

5. A method according to claim 1 wherein said separating grooves are generated in said thin film by sandblasting.

6. A method according to claim 1 wherein said separating grooves are generated in said thin film by grinding.

7. A method according to claim 1 wherein said separating grooves are generated in said thin film by sawing.

8. A method according to claim 1 wherein said separating grooves are generated in said thin film by planing.

9. A method according to claim 1 wherein said strip pattern is composed of self-adhesive plastic strip, a lacquer, or a foil.

10. A method according to claim 9 wherein said thin film solar cells are part of a superimposed series of multiple cells.

11. A method according to claim 1 wherein said strip pattern is produced by silk screening.

12. A method according to claim 1 wherein said strip pattern is removed by stripping.

13. A method according to claim 1 wherein said strip pattern is removed by treatment with a solvent.

14. A method according to claim 1 wherein removing said strip pattern further includes agitation by ultrasonic vibration.

* * * * *